US009014396B2

(12) United States Patent
Miao

(10) Patent No.: US 9,014,396 B2
(45) Date of Patent: Apr. 21, 2015

(54) SYSTEM AND METHOD OF REDUCING CLICK AND POP NOISE IN AUDIO PLAYBACK DEVICES

(75) Inventor: Guoqing Miao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1374 days.

(21) Appl. No.: 12/023,854

(22) Filed: Jan. 31, 2008

(65) Prior Publication Data

US 2009/0196435 A1 Aug. 6, 2009

(51) Int. Cl.
*H04B 15/00* (2006.01)
*H03F 1/30* (2006.01)
*H03F 3/187* (2006.01)
*H03F 3/45* (2006.01)

(52) U.S. Cl.
CPC ............... *H03F 1/305* (2013.01); *H03F 3/187* (2013.01); *H03F 3/45475* (2013.01); *H03F 2200/03* (2013.01); *H03F 2203/45136* (2013.01)

(58) Field of Classification Search
CPC ..... H03M 1/0881; H03G 1/007; H04R 3/002; H03F 1/305; H03F 3/04; H03F 3/16
USPC ............... 381/94.1, 94.5, 96, 94.8, 94.4, 120; 330/284
See application file for complete search history.

(56) References Cited

U.S. PATENT DOCUMENTS

| | | | | |
|---|---|---|---|---|
| 5,333,201 A | * | 7/1994 | Waller, Jr. ................. | 381/22 |
| 5,825,897 A | * | 10/1998 | Andrea et al. ............. | 381/71.6 |
| 6,600,365 B1 | | 7/2003 | Frith | |
| 6,774,684 B2 | * | 8/2004 | Wu et al. ................... | 327/134 |
| 7,020,293 B2 | * | 3/2006 | Shimotoyodome .......... | 381/94.5 |
| 7,092,534 B2 | * | 8/2006 | Wang et al. ................ | 381/94.5 |
| 7,113,031 B2 | | 9/2006 | Rabary et al. | |
| 7,224,218 B1 | | 5/2007 | Jiang et al. | |
| 2003/0058040 A1 | * | 3/2003 | Miyagaki et al. .......... | 330/10 |
| 2006/0023896 A1 | | 2/2006 | Ginsberg et al. | |
| 2008/0204133 A1 | * | 8/2008 | Fontaine et al. ........... | 330/69 |

FOREIGN PATENT DOCUMENTS

CN 101106357 A 1/2008
EP 0281117 A2 9/1988

(Continued)

OTHER PUBLICATIONS

International Search Report/Written Opinion—PCT/US09/032504—International Search Authority EPO—Aug. 11, 2009.

(Continued)

*Primary Examiner* — Jesse Y Miyoshi

(74) *Attorney, Agent, or Firm* — James Gutierrez

(57) ABSTRACT

An audio system that reduces or eliminates click and pop noise during power up and power down operations. In particular, the audio system includes an amplifier with an input adapted to receive an input audio signal and an output adapted to produce an amplified output audio signal for an associated speaker. The audio system further includes a noise reduction circuit adapted to smoothly apply and remove a DC voltage to and from the output of the amplifier in a manner that reduces or eliminates click and pop noise from being generated by the associated speaker. The DC voltage at the output of the amplifier may be derived from a DC reference voltage source and/or from the input audio signal.

23 Claims, 6 Drawing Sheets

(56) References Cited

FOREIGN PATENT DOCUMENTS

| | | |
|---|---|---|
| EP | 0482290 A2 | 4/1992 |
| EP | 0570655 A1 | 11/1993 |
| EP | 1229639 A2 | 8/2002 |
| EP | 1361656 A1 | 11/2003 |
| EP | 1879290 A2 | 1/2008 |
| JP | 2021686 | 1/1990 |
| JP | 2000341047 A | 12/2000 |
| JP | 2004518348 A | 6/2004 |
| JP | 2006020241 A | 1/2006 |
| JP | 2006080836 A | 3/2006 |
| JP | 2007013916 A | 1/2007 |
| WO | WO9845938 | 10/1998 |
| WO | WO0030247 | 5/2000 |
| WO | WO02058232 A1 | 7/2002 |

OTHER PUBLICATIONS

Taiwan Search Report—TW098103308—TIPO—Jul. 11, 2012.

* cited by examiner

SYSTEM AND METHOD OF REDUCING CLICK AND POP NOISE IN AUDIO PLAYBACK DEVICES

BACKGROUND

1. Field

The present disclosure relates generally to audio devices and systems, and more specifically, to a system and method of reducing click and pop noise in audio playback devices.

2. Background

In many audio systems, the output of an audio device is coupled to a speaker via a capacitor, typically referred to as a direct current (DC) blocking or alternating current (AC) coupling capacitor. Usually, the output of an audio device consists of an audio signal and an associated DC offset voltage. Prior to turning on the audio device, the voltage across the AC coupling capacitor is typically zero (0) Volt. When the audio device is turned on, the audio device charges the AC coupling capacitor to the associated DC offset voltage.

The charging of the AC coupling capacitor produces a rising voltage that typically has frequency components within the human audible range. These frequency components typically produce undesirable noise at the output of the speaker, which is typically referred to in the relevant art as "click and pop" noise. Similarly, when the audio device is turned off, the charge on the AC coupling capacitor decays producing a falling voltage that typically also has frequency components within the human audible range. Again, these frequency components produce undesirable click and pop noise at the output of the speaker. This is better explained with reference to the following example.

FIG. 1 illustrates a block diagram of an exemplary conventional audio system 100. The audio system 100 delivers an audio signal to a speaker 150 via an AC coupling capacitor $C_{AC}$. In this example, the audio system 100 consists of a first operational amplifier OPA1, a second operational amplifier OPA2, and resistors $R_{1A}$, $R_{1B}$, $R_{2A}$ and $R_{2B}$. The first operational amplifier OPA1 serves to amplify the input audio signal, which may be configured as a differential signal $V_{im}$ and $V_{ip}$. The second operational amplifier OPA2 is configured as a voltage-follower to generate a reference DC voltage $V_{ref}$ at the output of the first operational amplifier OPA1. This voltage $V_{ref}$ is typically set to Vdd/2 to optimize or improve the dynamic range of the audio signal at the output of the first operational amplifier OPA1.

The resistors $R_{1A}$ and $R_{1B}$ serve as input resistors to the first operational amplifier OPA1 from the perspective of the input audio signal $V_{im}$ and $V_{ip}$. The resistor $R_{2B}$ serves as an input resistor to the first operational amplifier OPA1 from the perspective of the reference voltage $V_{ref}$ generated by the second operational amplifier OPA2. The resistor $R_{2A}$ serves as a feedback resistor for the first operational amplifier OPA1.

Prior to the audio system 100 being turned on, the voltage across the AC coupling capacitor $C_{AC}$ is typically about zero (0) Volt. When the first and second operational amplifiers OPA1-2 are initially turned on via the EN1 and EN2 power inputs, the voltage across the AC coupling capacitor $C_{AC}$ begins to rise from zero (0) Volt towards the reference voltage $V_{ref}$. Typically, the transitioning voltage has frequency components that lie within the human audible range. This typically produces an undesirable click and pop noise at the output of the speaker 150.

When the audio system 100 is turned off, the voltage across the AC coupling capacitor $C_{AC}$ decays from the reference voltage $V_{ref}$ towards zero (0) Volt. Similarly, the transitioning voltage typically has frequency components that lie within the human audible range. This also produces an undesirable click and pop noise at the output of the speaker 150.

SUMMARY

An aspect of the disclosure relates to an audio system that reduces or eliminates click and pop noise during power up and power down operations. In particular, the audio system comprises an amplifier, such as an operational amplifier, including an input adapted to receive an input audio signal and an output adapted to produce an amplified output audio signal for an associated speaker. The audio system further comprises a noise reduction circuit adapted to smoothly apply or remove a voltage to or from the output of the amplifier in a manner that reduces or eliminates click and pop noise from being generated by the associated speaker. The voltage at the output of the amplifier may be derived from a DC reference voltage source and/or from the input audio signal.

In another aspect of the disclosure, the noise reduction circuit comprises a selectable current path adapted to smoothly dissipate charges from the output of the amplifier during a power down operation. The smoothly dissipation of the charges from the output of the amplifier decreases the output voltage in a manner that the transitioning voltage has frequency components that lie substantially outside of the human audible range. In an exemplary embodiment, the selectable current path comprises a resistor in series with the drain and source of a field effect transistor (FET), wherein the selectable current path is coupled between the output of the amplifier and ground or Vss potential rail. In response to a power down operation, a control signal is applied to the gate of the FET to turn on the FET, allowing charges from the output of the amplifier to dissipate to ground or Vss potential.

In yet another aspect of the disclosure, the noise reduction circuit comprises a controllable resistance device coupled between a source of a DC reference voltage and the output of the amplifier. Additionally, the noise reduction circuit comprises a generator adapted to generate a control signal that decreases the resistance of the controllable resistance device in a manner that the DC reference voltage from the source is smoothly applied to the output of the amplifier in a manner that reduces or eliminates click and pop noise from being generated by the associated speaker during a power up operation. The generator may comprise a ramp signal generator, and the controllable resistance device may comprise a transistor, such as a FET.

In still another aspect of the disclosure, the noise reduction circuit comprises a controllable resistance device coupled to the input of the amplifier, and a generator adapted to generate a control signal that decreases or increases the resistance of the controllable resistance device so that that the input audio signal is smoothly applied to or removed from the input of the amplifier in a manner that reduces or eliminates click and pop noise from being generated by an associated speaker during a power up or power down operation. The generator may comprise a ramp signal generator, and the controllable resistance device may comprise a transistor, such as a FET.

Other aspects, advantages and novel features of the present disclosure will become apparent from the following detailed description of the disclosure when considered in conjunction with the accompanying drawings.

DETAILED DESCRIPTION

Figure 1:
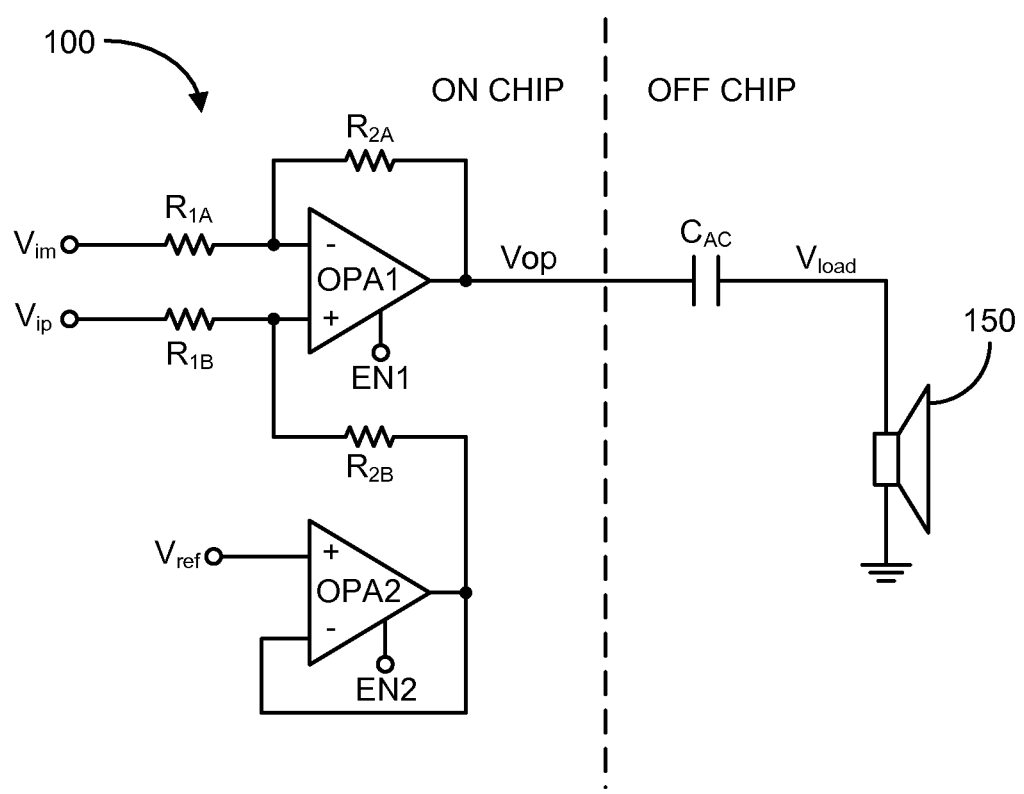
FIG. 1 illustrates a block diagram of an exemplary conventional audio system.
Figure 2:
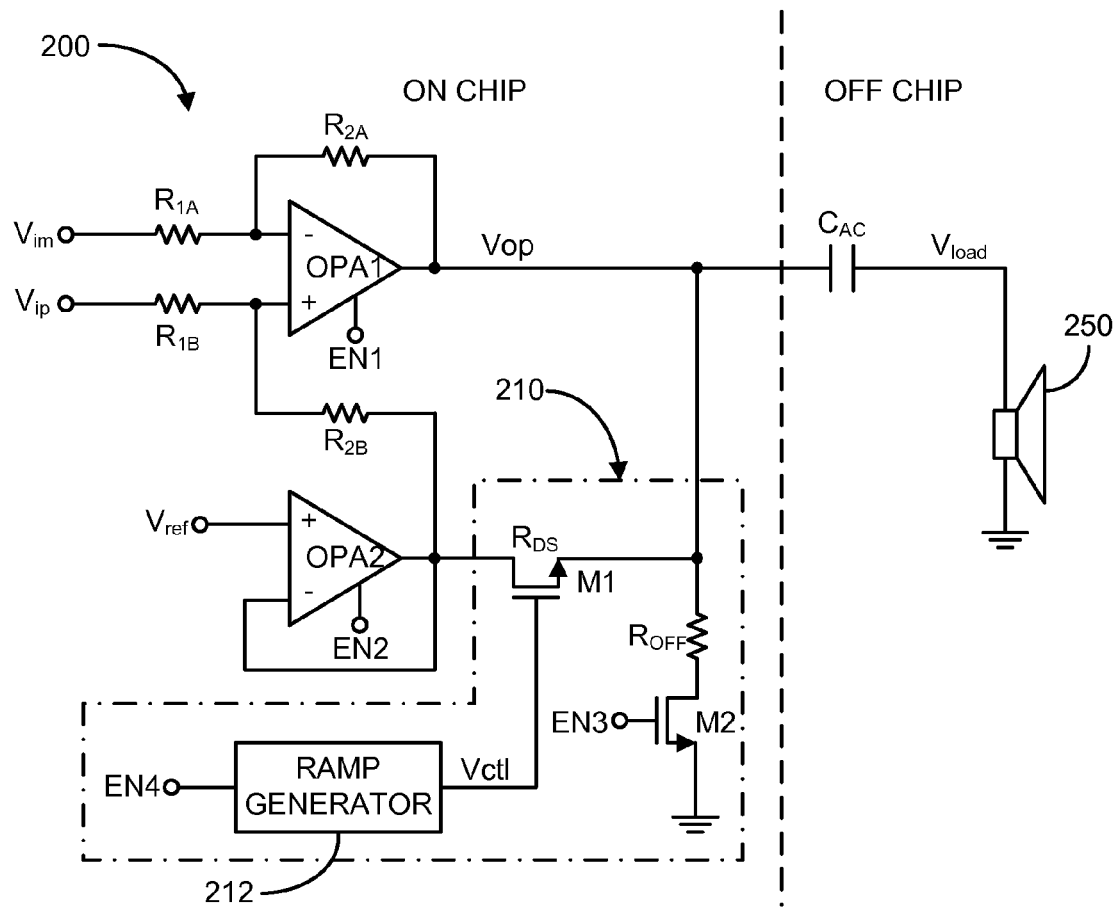
FIG. 2 illustrates a block diagram of an exemplary audio system in accordance with an embodiment of the disclosure.

FIG. 2 illustrates a block diagram of an exemplary audio system 200 in accordance with an embodiment of the disclosure. The audio system 200 includes a noise reduction circuit that is adapted to reduce or completely eliminate click and pop noise generated at an output of an associated speaker. In particular, the noise reduction circuit performs this by providing a relatively smooth rise and fall of the voltage across an AC coupling capacitor during power-up and power-down, such that the frequency components of the transitioning voltage lie substantially outside of the human audible range.

More specifically, the audio system 200 comprises a first operational amplifier OPA1, a second operational amplifier OPA2, resistors $R_{1A}$, $R_{1B}$, $R_{2A}$ and $R_{2B}$, and a noise reduction circuit 210. The noise reduction circuit 210, in turn, comprises a ramp generator 212, a first field effect transistor (FET) M1, a second FET M2, and a resistor $R_{OFF}$. These devices may be implemented as one or more integrated circuits, as discrete devices, or as a combination of one or more integrated circuits and one or more discrete devices. The output of the first operational amplifier OPA1 is adapted to couple to a speaker 250 via an AC coupling capacitor $C_{AC}$, both of which may be situated external to the one or more integrated circuits incorporating the audio system 200.

The first operational amplifier OPA1 is adapted to amplify an input audio signal to a sufficient level to drive the associated speaker 250. In this example, the input audio signal is configured as a differential signal having a positive component $V_{ip}$ and a negative component $V_{im}$. The first operational amplifier OPA1 includes a positive input (+) adapted to receive the positive component $V_{ip}$ of the input audio signal by way of resistor $R_{1B}$. The first operational amplifier OPA1 also includes a negative input (−) adapted to receive the negative component $V_{im}$ of the input signal by way of resistor $R_{1A}$. The resistor $R_{2A}$ is coupled between the output and the negative input (−) of the first operational amplifier OPA1, and serves to set the gain of the first operational amplifier OPA1. The first operational amplifier OPA1 further includes a control input adapted to receive a control signal EN1 that enables or disables the amplifier OPA1.

The second operational amplifier OPA2 is configured as a voltage-follower adapted to receive and output a DC reference voltage $V_{ref}$ so that it can be generated at the output of the first operational amplifier OPA1. The reference voltage $V_{ref}$ may be set to half of the power supply voltage Vdd for the first operational amplifier OPA1 (e.g., Vdd/2). This improves or optimizes the dynamic range of the audio signal generated at the output of the first operational amplifier OPA1. The second operational amplifier OPA2 includes a positive input (+) adapted to receive the DC reference voltage $V_{ref}$, and a negative input (−) coupled to its output. The output of the second operational amplifier OPA2 is coupled to the positive input (+) of the first operational amplifier OPA1 by way of resistor $R_{2B}$. The output of the second operational amplifier OPA2 is also coupled to the drain of the first FET M1 of the noise reduction circuit 210. The second operational amplifier OPA2 further includes a control enable input adapted to receive a control signal EN2 that enables or disables the amplifier OPA2.

The ramp generator 212 of the noise reduction circuit 210 includes a control input adapted to receive a control signal EN4 that enables or disables the ramp generator 212. The ramp generator 212 includes an output that is electrically coupled to the gate of the first FET M1. The ramp generator 212 produces at its output a rising ramp control voltage Vctl, as discussed in more detail below. The source of the first FET M1 is electrically coupled to the output of the first operational amplifier OPA1, and to the drain of the second FET M2 by way of resistor $R_{OFF}$. The gate of the second FET M2 is adapted to receive a control signal EN3. The source of the second FET M2 may be coupled to ground potential or a relatively "negative" supply voltage Vss. The operation of the audio system 200 will now be explained.

Figure 3:
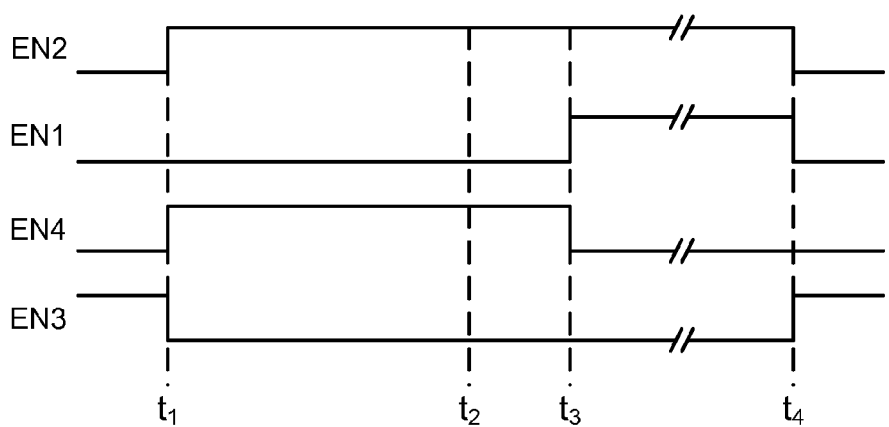
FIG. 3 illustrates a timing diagram of exemplary control signals for the audio system in accordance with another aspect of the disclosure.

FIG. 3 illustrates a timing diagram of exemplary control signals EN1-4 for the audio system 200 in accordance with another aspect of the disclosure. In this example, the control signals EN1-4 are binary with a high logic level indicating that the corresponding device is enabled, and a low logic level indicating that the corresponding device is disabled. It shall be understood that the control signals EN1-4 may be configured in other manners to achieve the operation of the audio system 200 as discussed herein. In the timing diagram, there are four (4) particular times indicated $t_1$, $t_2$, $t_3$ and $t_4$. The first time $t_1$ indicates the beginning of the power-up operation of the audio system 200. The second time $t_2$ indicates when the ramp control voltage Vctl reaches its final value (e.g., Vdd). The third time $t_3$ indicates the time when the first operational amplifier OPA1 is enabled, and marks the end of the power-up operation. The fourth time $t_4$ indicates the beginning of the power-down operation of the audio system 200.

Prior to time $t_1$, the control signals EN1, EN2, and EN4 are all in a low logic level, and the control signal EN3 is in a high logic level. Thus, with these logic levels, the first and second operational amplifiers OPA1-2 and the ramp generator 212 are disabled, and the second FET M2 is turned on to effectively ground the output of the first operational amplifier OPA1. At time $t_1$, the control signals EN2 and EN4 transition from the low logic level to the high logic level, and control signal EN3 transitions from the high logic level to the low logic level. The high logic levels of control signals EN2 and EN4 enable the second operational amplifier OPA2 and the ramp generator 212, and the low logic level of control signal EN3 turns off the second FET M2.

The enabling of the second operational amplifier OPA2 causes the DC reference voltage $V_{ref}$ to be produced at the drain of the first FET M1. The enabling of the ramp generator 212 causes the control voltage Vctl to rise in a relatively smooth fashion, as discussed in more detail below. The second FET M2 being turned off removes a current path between the output of the first operational amplifier OPA1 and ground or Vss potential.

The smooth rising control voltage Vctl causes the resistance $R_{DS}$ of the first FET M1 to decrease in a relatively smooth fashion. The decreasing resistance of the first FET M1 smoothly applies the DC reference voltage $V_{ref}$ to the output of the first operational amplifier OPA1. As a consequence, the voltage across the DC blocking capacitor $C_{AC}$ rises in a relatively smooth fashion, such that the frequency components of the rising voltage lie substantially outside of the typical human audible range. This prevents or reduces click and pop noise from being generated by the associated speaker 250 during power up of the audio system 200.

The ramp voltage Vctl continues to rise until it reaches its final or maximum voltage at time $t_2$, which may be configured to substantially coincide with Vdd. At time $t_3$, control voltage EN1 transitions from the low logic level to the high logic level to enable the first operational amplifier OPA1, and control voltage EN4 transitions from the high logic level to the low logic level to disable the ramp generator 212. The enabling of the first operational amplifier OPA causes it to produce at its output, the output audio signal and the DC reference voltage $V_{ref}$ that is applied to its positive input (+) by the second operational amplifier OPA2 via the resistor $R_{2B}$. Since the voltage at the output of the first operational amplifier OPA1 is already at substantially the DC reference voltage $V_{ref}$ due to noise reduction circuit 210, the enabling of the first operational amplifier OPA1 does not cause a substantial change in its output DC voltage, thereby also reducing or eliminating click and pop noise from being generated by the associated speaker 250. The disabling of the ramp generator 212 causes the control voltage Vctl to drop to substantially zero (0) Volt, thereby turning off the first FET M1.

Between times $t_3$ and $t_4$, the control signals EN3 and EN4 are in the low logic level to effectively disable the noise reduction circuit 210 during steady-state or normal operation of the audio system 200. With these control signals being in the low logic level, the first and second FETs M1 and M2 are turned off, so that the noise reduction circuit 210 does not significantly affect the operation of the remaining audio system 200. During steady-state or normal operation between times $t_3$ and $t_4$, the first operational amplifier OPA1 operates to amplify a differential input audio signal $V_{ip}$ and $V_{im}$. The second operational amplifier OPA2 operates to continue producing the DC reference voltage $V_{ref}$ at the output of the first operational amplifier OPA1 to improve the dynamic range of the output audio signal.

As mentioned above, the time $t_4$ indicates the start of the power down operation of the audio system 200. At this time, the control signals EN1-2 transition from the high logic level to the low logic level to respectively disable the first and second operational amplifiers OPA1-2. At the same time, the control signal EN3 transitions from the low logic level to the high logic level to turn on the second FET M2. The resistor $R_{OFF}$ and second FET M2 form a current path to ground to smoothly dissipate the voltage across the DC blocking capacitor $C_{AC}$. The resistor $R_{OFF}$ is configured to provide a relatively smooth dissipation of the output voltage such that the frequency components of the transitioning voltage lie substantially outside of the typical human audible range, so as to reduce or eliminate click and pop noise during power down of the audio system 200.

Figure 4A:
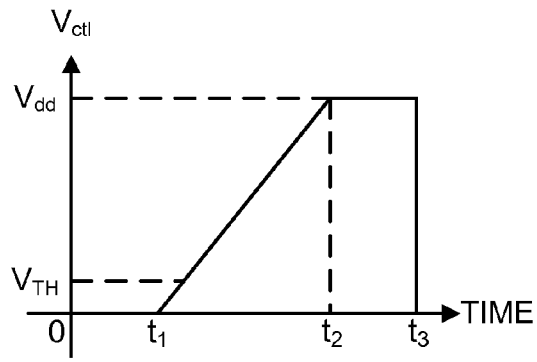
FIGS. 4A-D illustrate graphs of exemplary signals generated by the audio system in response to a power-up condition in accordance with another aspect of the disclosure.
Figure 4B:
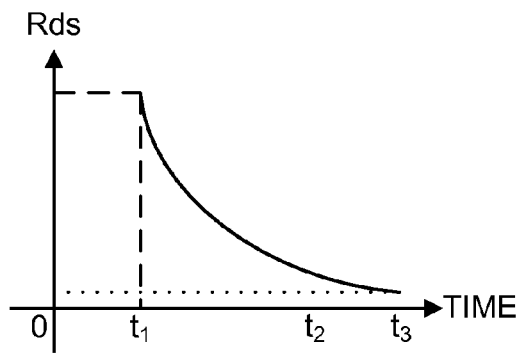
Figure 4C:
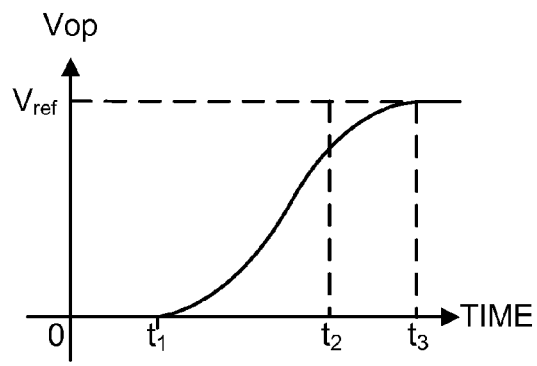
Figure 4D:
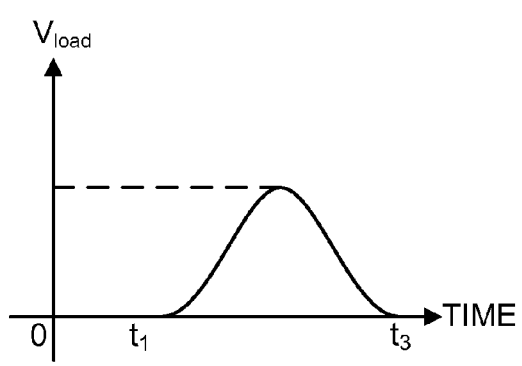

FIGS. 4A-D illustrate graphs of exemplary signals generated by the audio system 200 in response to a power-up condition in accordance with another aspect of the disclosure. In particular, the graph depicted in FIG. 4A illustrates the time variation of the control voltage Vctl generated by the ramp generator 212. The graph depicted in FIG. 4B illustrates the time variation of the resistance Rds of the first FET M1. The graph depicted in FIG. 4C illustrates the time variation of the output voltage Vop of the audio system 200. The graph depicted in FIG. 4D illustrates the time variation of the voltage $V_{load}$ across the associated speaker 250.

As the graph of FIG. 4A illustrates, the control voltage Vctl generated by the ramp generator 212 may rise substantially linear from zero (0) Volt to Vdd. At some time between times $t_1$ and $t_2$, the ramp voltage Vctl crosses the threshold voltage of the first FET M1. This causes the first FET M1 to begin conducting current significantly. This is better shown by the graph of FIG. 4B, which illustrates the relatively smooth fall of the resistance Rds of the first FET M1. The falling resistance Rds of the first FET M1 smoothly applies the DC reference voltage $V_{ref}$ generated by the second operational amplifier OPA2 to the output of the audio system 200. This is better shown by the graph of FIG. 4C, which illustrates the output voltage rising smoothly from zero (0) Volt at time $t_1$ to substantially the DC reference voltage $V_{ref}$ at time $t_2$. The voltage $V_{load}$ across the load (e.g., the associated speaker 250) is essentially the derivative of the output voltage due to the DC blocking capacitor $C_{AC}$, which basically exhibits a half cycle of a sine wave between time $t_1$ and $t_3$. The noise reduction circuit 210 is configured to produce a smooth load $V_{load}$ voltage such that its frequency components lie outside of the typical human audible range to reduce or eliminate click and pop noise.

Figure 5:
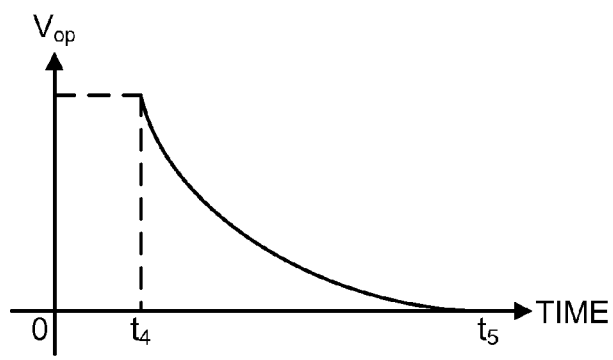
FIG. 5 illustrates a graph of an exemplary signal generated by the audio system in response to a power-down condition in accordance with another aspect of the disclosure.

FIG. 5 illustrates a graph of an exemplary signal generated by the audio system 200 in response to a power-down condition in accordance with another aspect of the disclosure. In particular, the graph of FIG. 5 shows the time variation of the output voltage Vop of the audio system 200 during power down. As illustrated, at time $t_4$, which as discussed above indicates the beginning of the power down operation, the output voltage of the audio system 200 decays in a relatively smooth fashion until it is essentially zero (0) at time $t_5$. The noise reduction circuit 210 is configured to produce a smoothly decaying output voltage Vop such that its frequency components lie outside of the typical human audible range to reduce or eliminate click and pop noise.

Figure 6:
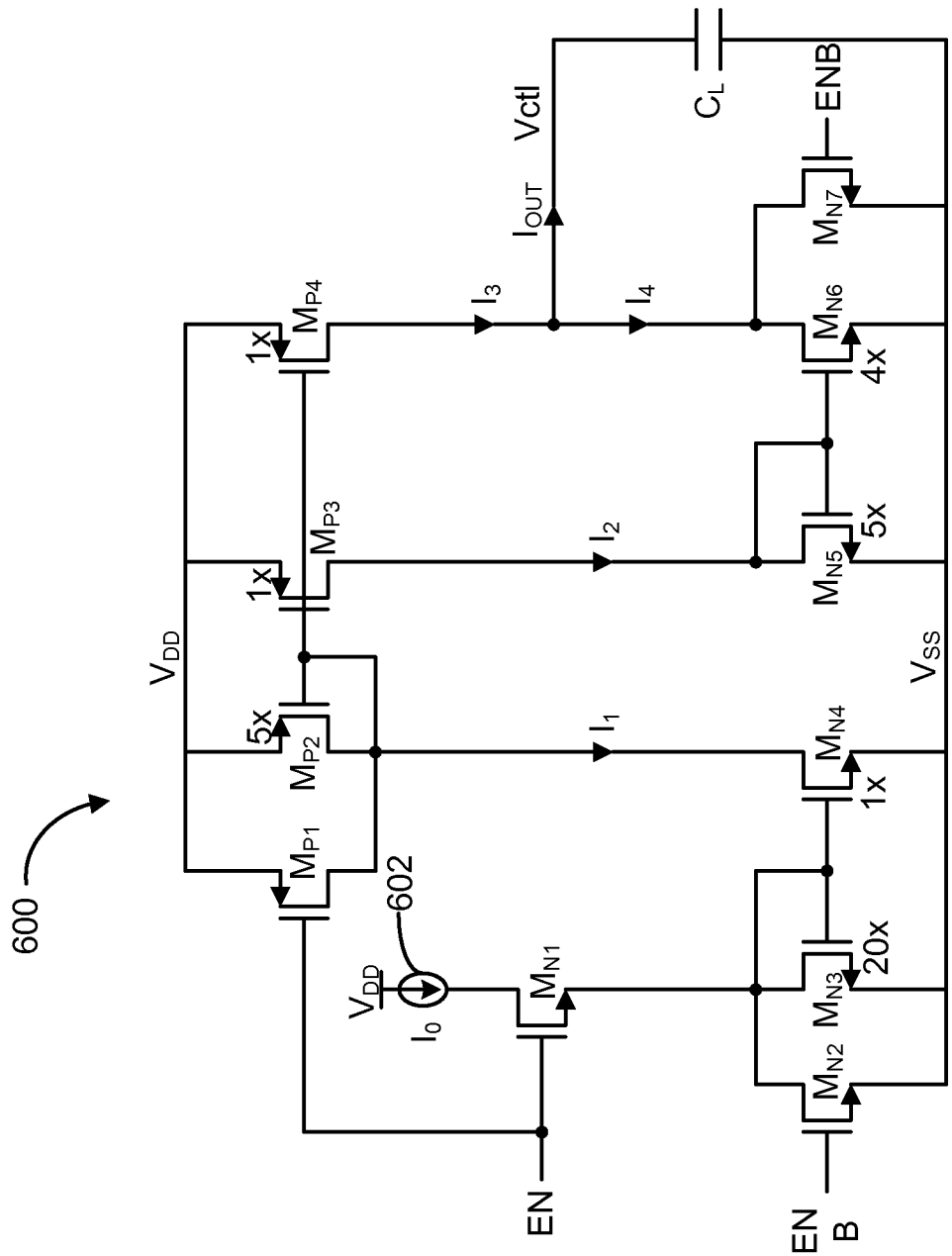
FIG. 6 illustrates a schematic diagram of an exemplary ramp generator in accordance with another aspect of the disclosure.

FIG. 6 illustrates a schematic diagram of an exemplary ramp generator 600 in accordance with another aspect of the disclosure. The ramp generator 212 of the noise reduction circuit 210 previously discussed may be configured as per ramp generator 600. The ramp generator 600 comprises a current generator 602, p-channel FETs $M_{P1-4}$, n-channel FETs $M_{N1-7}$, and capacitor $C_L$. The sources of FETs $M_{P1-4}$ are electrically coupled to the positive power supply rail Vdd, and the gates of FETs $M_{P2-4}$ are electrically coupled to the drains of FETs $M_{P1-2}$ and to the drain of FET $M_{N4}$. The gate of FET $M_{P1}$ is electrically coupled to the gate of FET $M_{N1}$, and both are adapted to receive control signal EN. The drain of FET $M_{P3}$ is electrically coupled to the drain of FET $M_{N5}$, and the gates of FET $M_{N5-6}$. The drain of FET $M_{P4}$ is electrically coupled to the drains of FETs $M_{N6-7}$, and to a first end of capacitor $C_L$.

The current generator 602 is coupled between the positive power supply rail Vdd and the drain of FET $M_{N1}$. The source of FET $M_{N1}$ is electrically coupled to the drains of FETs $M_{N2-3}$ and gates of FETs $M_{N3-4}$. The gates of the FET $M_{N2}$ and $M_{N7}$ are adapted to receive the control signal ENB (e.g., compliment of control signal EN). The drains of the FETs $M_{N2-7}$ as well as the second end of capacitor $C_L$ are electrically coupled to the negative power supply rail Vss, which could be at ground potential.

In operation, the ramp circuit 600 is disabled when the control signal EN is at a low logic level and control signal ENB is at a high logic level. The control signal EN being at the low logic level turns off FET $M_{N1}$ to prevent current flowing through FET $M_{N3}$ and consequently through the FET $M_{N4}$ due to its mirror configuration with FET $M_{N3}$. Also, the control signal EN being at the low logic level turns on FET $M_{P1}$, which couples Vdd to the gates of FETs $M_{P2-4}$, thereby turning off these FETs. The control signal ENB being at the high logic level turns on FETs $M_{N2}$ and $M_{N7}$ to ground the respective drains of FETs $M_{N3-4}$ and $M_{N6-7}$ to reduce or eliminate current leakage through these transistors. Accordingly, the currents $I_{0-4}$ are substantially nil when the ramp circuit 600 is disabled.

When the control signal EN transitions to a high logic level and the control signal ENB transitions to a low logic level, the ramp circuit 600 is enabled. The control signal EN being at the high logic level turns on FET $M_{N1}$ and turns off FET $M_{P1}$. The control signal ENB being at the low logic level turns off $M_{N2}$ and $M_{N7}$. The turning on of FET $M_{N1}$ electrically couples the current source 602 to the drain of FET $M_{N3}$, and the turning off of transistor $M_{N2}$ removes the shorting or bypassing of FET $M_{N3}$. This allows current $I_0$ to flow from the current source 602 to the Vss rail via the FETs $M_{N1}$ and $M_{N3}$. This current also allows FET $M_{N4}$ to conduct current $I_1$.

The turning off of FET $M_{P1}$ removes the shorting or bypassing of FET $M_{P1}$, which consequently turns on FETs $M_{P2}$, $M_{P3}$ and $M_{P4}$ because Vdd is no longer applied to their gates. This allows currents $I_1$, $I_2$, and $I_3$ to flow through FETs $M_{P2}$, $M_{P3}$ and $M_{P4}$. The turning off of FET $M_{N7}$ removes the shorting or bypassing of FET $M_{N6}$, thereby allowing current $I_4$ to flow through FET $M_{N6}$. The output current $I_{OUT}$ that produces the ramp voltage Vctl across the capacitor $C_L$ is the difference between the currents $I_3$ and $I_4$ (e.g., $I_{OUT}=I_3-I_4$).

The ramp circuit 400 may be configured to generate the ramp voltage Vctl using a capacitor $C_L$ that may be implemented in an integrated circuit due to a relatively small output current $I_{OUT}$. For instance, the FET $M_{N3}$ may be configured to have a channel width 20 times (20×) greater than the channel width of FET $M_{N4}$. Thus, due to the current mirror configuration of FETs $M_{N3}$ and $M_{N4}$, the current I1 is substantially 20 times less than the current $I_0$ (e.g., $I_1=\frac{1}{20}*I_0$). Similarly, the FET $M_{P2}$ may be configured to have a channel width five (5) times (5×) greater than the channel widths of FETs $M_{P3}$ and $M_{P4}$. Thus, due to the current mirror configuration of FETs $M_{P2}$, $M_{P3}$, and $M_{P4}$, the currents $I_2$ and $I_3$ are substantially five (5) times less than the current $I_1$ (e.g., $I_2=I_3=\frac{1}{5}*I_1$). The FET $M_{N5}$ may be configured to have a channel width 5/4 times greater than the channel width of $M_{N6}$. Thus, due to the current mirror configuration of FETs $M_{N5}$ and $M_{N6}$, the current $I_4$ is 4/5 times the current $I_2$ (e.g., $I_4=\frac{4}{5}*I_2$).

Using the fact that the current $I_1$ is 20 times less than the current $I_0$, the current $I_3$ may be written in terms of $I_0$ as follows:

$$I_3=\frac{1}{5}*I_1=\frac{1}{100}*I_0 \qquad \text{Eq. 1}$$

Also, using the fact that the current $I_2$ is also 100 times less than the current $I_0$, the current $I_4$ may be written in terms of $I_0$ as follows:

$$I_4=\frac{4}{5}*I_2=4/500*I_0 \qquad \text{Eq. 2}$$

As discussed above, the output current $I_{OUT}$ may be represented as follows:

$$I_{OUT}=I_3-I_4 \qquad \text{Eq. 3}$$

Substituting $I_3$ and $I_4$ as provided in Eqs. 1 and 2 for $I_3$ and $I_4$ as provided in Eq. 3, the output current $I_{OUT}$ may be presented as follows:

$$I_{OUT}=\frac{1}{100}*I_0-4/500*I_0=\frac{1}{500}*I_0 \qquad \text{Eq. 4}$$

For example, if $I_0$ is chosen to be approximately two (2) microamps, the output current $I_{OUT}$ would be approximately 4 nanoamps. Such a small current would allow the capacitor $C_L$ to be implemented in an integrated circuit, and still provide a ramping control Vctl with the proper rise time so as to reduce or eliminate click and pop noise from being generated by the associated speaker 250 during power up operation.

Figure 7:
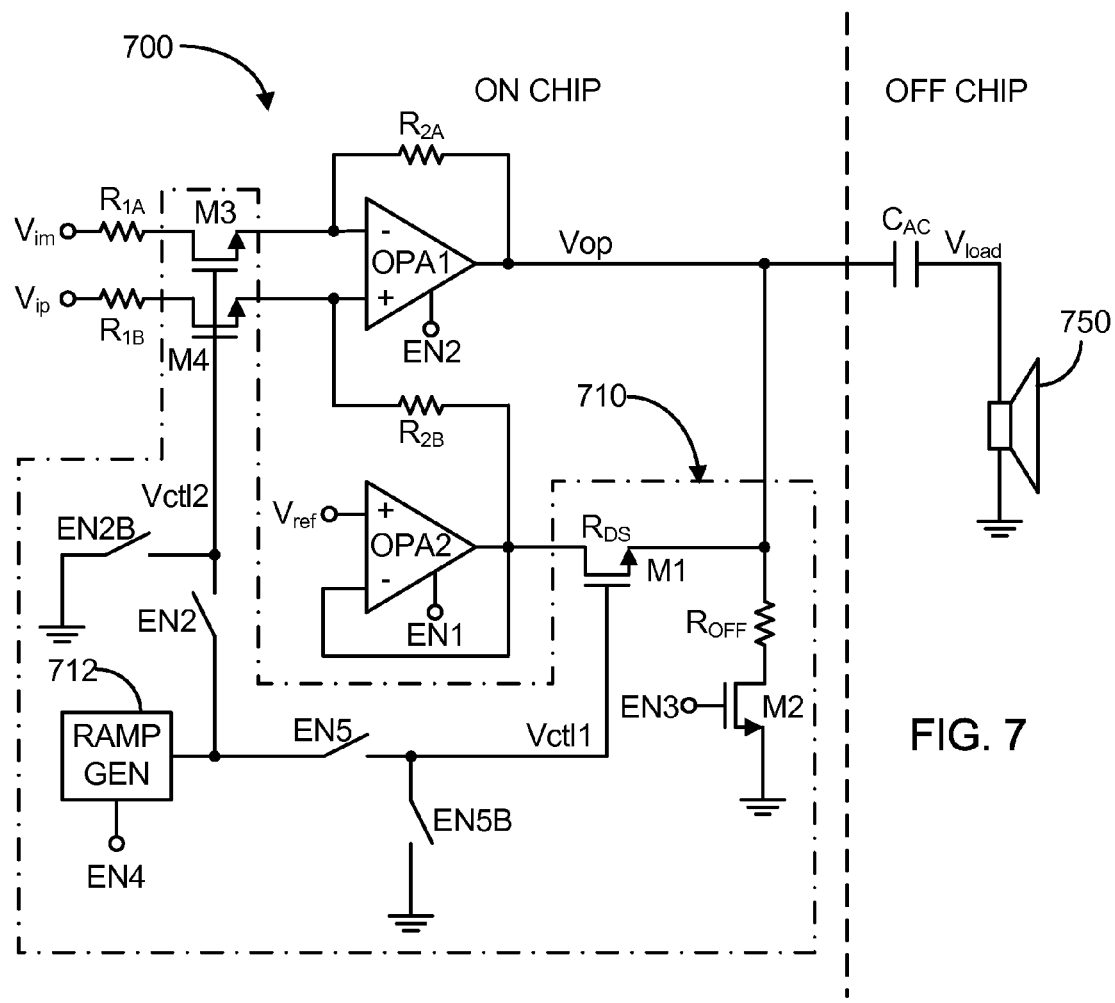
FIG. 7 illustrates a block diagram of a second exemplary audio system in accordance with another aspect of the disclosure.

FIG. 7 illustrates a block diagram of a second exemplary audio system 700 in accordance with another aspect of the disclosure. In addition to reducing or eliminating click and pop noise due to applying and removing a DC reference voltage Vref to and from its output, the audio system 700 is configured to reduce or eliminate click and pop noise due to DC offset voltage present in the input audio signal. The main audio amplifier of the audio system 700 amplifies the input audio signal including the DC offset voltage to produce a DC offset voltage at its output. During power up, such DC offset voltage may also cause click and pop noise to be generated by the associated speaker.

In particular, the audio system 700 comprises a first operational amplifier OPA1, a second operational amplifier OPA2, and a noise reduction circuit 710. The first operational amplifier OPA1 is configured to amplify the input audio signal. The second operational amplifier OPA2 is configured to provide a DC reference voltage (e.g., Vref~Vdd/2) at the output of the first operational amplifier OPA1 to improve or substantially optimize the dynamic range of the output audio signal. The noise reduction circuit 710 is adapted to reduce or eliminate click and pop noise from being generated by an associated speaker 750 due to providing the DC reference voltage Vref to the output of the first operational amplifier OPA1, and DC offset voltage present at the input audio signal which ends up at the output of the first operational amplifier OPA1.

More specifically, the first operational amplifier OPA1 includes a negative input (−) adapted to receive a negative component $V_{im}$ of the input audio signal by way of input resistor $R_{1A}$ and FET M3 (which is a component of the noise reduction circuit 710). The first operational amplifier OPA1 also includes a positive input (+) adapted to receive a positive component $V_{ip}$ of the input audio signal by way of input resistor $R_{1B}$ and FET M4 (which is a component of the noise reduction circuit 710). The first operational amplifier OPA1 further includes an output coupled to the associated speaker 750 by way of an AC coupling capacitor $C_{AC}$. A feedback resistor $R_{2A}$ is coupled between the output and negative input (−) of the first operational amplifier OPA1. The first operational amplifier OPA1 includes an input adapted to receive control signal EN2.

The second operational amplifier OPA2 is configured as a voltage-follower to produce a DC reference voltage Vref to the positive input terminal (+) of the first operational amplifier OPA1. The second operational amplifier OPA2 includes a positive input (+) adapted to receive the DC reference voltage Vref. The second operational amplifier OPA2 also includes a negative input (−) coupled to its output. The output of the second operational amplifier OPA2 is electrically coupled to the positive input (+) of the first operational amplifier OPA1 by way of resistor $R_{2B}$. The second operational amplifier OPA2 includes an input adapted to receive a control signal EN1.

The noise reduction circuit 710 comprises a ramp generator 712, FETs M1-M4, resistor $R_{OFF}$, and controllable switches responsive to control signals EN2, EN2B, EN5, and EN5B. In particular, FET M1 includes a drain electrically coupled to the output of the second operational amplifier OPA2, a source electrically coupled to the output of the first operational amplifier OPA1, and a gate electrically coupled to the ramp generator 712 by way of controllable switch EN5. The FET M2 includes a drain electrically coupled to the output of the first operational amplifier OPA1 by way of resistor $R_{OFF}$, a source electrically coupled to ground or Vss, and a gate adapted to receive control signal EN3.

The FET M3 includes a drain adapted to receive the negative component $V_{im}$ of the input audio signal by way of resistor $R_{1A}$, a source electrically coupled to the negative input (−) of the first operational amplifier OPA1, and a gate electrically coupled to the gate of FET M4 and to the ramp generator 712 by way of controllable switch EN2. The FET M4 includes a drain adapted to receive the positive component $V_{ip}$ of the input audio signal by way of resistor $R_{1B}$, a source electrically coupled to the positive input (+) of the first operational amplifier OPA1, and a gate electrically coupled to the gate of FET M3 and to the ramp generator 712 by way of controllable switch EN2. The controllable switch EN2B is electrically coupled between the gates of FETs M3 and M4 and ground or Vss. The controllable switch EN5B is electrically coupled between the gate of FET M1 and ground or Vss. The operation of the audio system 700 is explained as follows.

Figure 8:
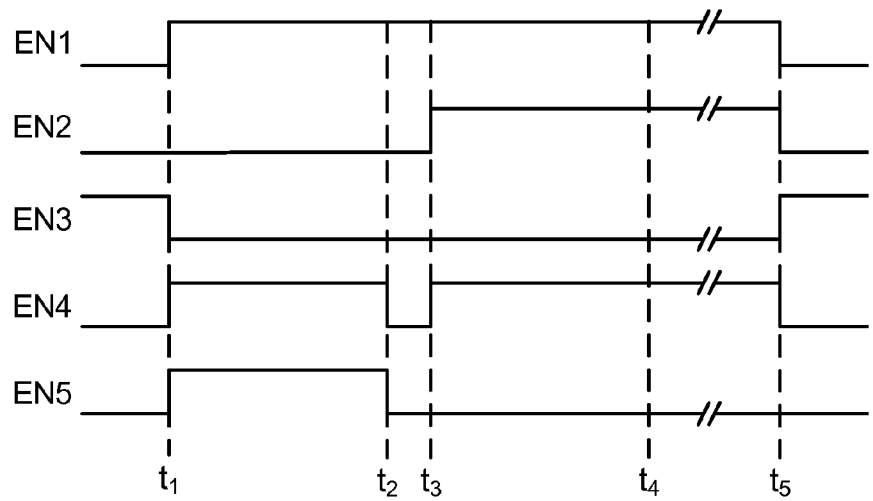
FIG. 8 illustrates a timing diagram of exemplary control signals for the second audio system in accordance with another aspect of the disclosure.

FIG. 8 illustrates a timing diagram of exemplary control signals for the audio system 700 in accordance with another aspect of the disclosure. The timing diagram includes five (5) noted times, t1-5. The time t1 represents the beginning of the power up operation of the audio system 700, and in particular, the process of smoothly applying the DC reference voltage Vref to the output of the first operational amplifier OPA1 in a manner that reduces or eliminates click and pop noise from being generated by the associated speaker 750. The time t2 represents the end of the process of smoothly applying the DC reference voltage Vref to the output of the first operational amplifier OPA1. The time t3 represents the start of coupling the input audio signal (which may include a DC offset voltage) to the input of the first operational amplifier OPA1 in a manner that reduces or eliminates click and pop noise from being generated by the associated speaker 750. The time t4 represents the end of the process of coupling the input audio signal to the input of the first operational amplifier OPA1. And, the time t5 represents the beginning of the power down operation of the audio system 700.

Prior to time t1, the control signals EN1, EN2, EN4, and EN5 are at a low logic level, and control signal EN3 is at a high logic level. In this configuration, the first and second operational amplifiers OPA1-2 and ramp generator 712 are disabled, the FETs M1, M3, and M4 are turned off, FET M2 is turned on, controllable switches EN2 and EN5 are in their open position, and controllable switches EN2B and EN5B are in their closed position.

At time t1, the control signals EN1, EN4, and EN5 transition from the low logic level to the high logic level, and control signal EN3 transition from the high logic level to the low logic level. The control signal EN1 being at the high logic level causes the second operational amplifier OPA2 to produce the DC reference voltage Vref at its output and at the drain of FET M1. The control signal EN5 being at the high logic level causes the controllable switch EN5 to be in the closed position, and the controllable switch EN5B to be in the open position. The control signal EN4 being at the high logic level enables the ramp generator 712 to start generating a first ramp control voltage Vctl1. The control signal EN3 being at the low logic level turns off FET M2.

Between times t1 and t2, the rising first control voltage Vctl1 causes the resistance $R_{DS}$ of FET M1 to decrease in a relatively smooth fashion, so as to smoothly apply the DC reference voltage Vref to the output of the first operational amplifier OPA1 in a manner that reduces or eliminates click and pop noise from being generated by the associated speaker 750, as previously discussed in more detail with reference to the prior embodiment. By time t2, the voltage at the output of the first operational amplifier OPA1 should be substantially at the DC reference voltage Vref. At time t2, the control signals EN4 and EN5 transition from the high logic level to the low logic level to disable the ramp generator 712, open controllable switch EN5 to decouple the ramp generator 712 from the gate of FET M1, and close controllable switch EN5B to ensure that FET M1 is turned off.

At time t3, the enable signals EN2 and EN4 transition from the low logic level to the high logic level. The control signal EN2 being at the high logic level enables the first operational amplifier OPA1, closes controllable switch EN2, and opens controllable switch EN2B. The control signal EN4 being at the high logic level enables ramp generator 712 to start generating a second ramp control voltage Vctl2. Between times t3 and t4, the rising control voltage Vctl2 causes the resistances of FETs M3 and M4 to decrease in a relatively smooth fashion, so as to smoothly apply the input audio signal including its DC offset voltage to the input of the first operational amplifier OPA1, and consequently, to the output of the first operational amplifier OPA1 in a manner that reduces or eliminates click and pop noise from being generated by the associated speaker 750.

Between times t4 and t5, the audio system 700 is operating in normal or steady state mode by amplifying the input audio signal to generate an output audio signal with sufficient power level to drive the associated speaker 750. During normal or steady state operation, the controllable switch EN2 remains closed and the ramp generator 712 generates a high logic level to maintain the FETs M3 and M4 turned on. At time t5, which as discussed above indicate the start of the power down operation, the control signals EN1, EN2, and EN4 transition from the high logic level to the low logic level, the control signal EN3 transitions from the low logic level to the high logic level, and the control signal E5 remains at the low logic level. This brings the audio system 700 to its off mode by disabling the first and second operational amplifiers OPA1-2 and the ramp generator 712, and turning on FET M2. The turning on of FET M2 causes the charges across the capacitor $C_{AC}$ to dissipate in a relatively smooth fashion so as to prevent click and pop noise from being generated by the associated speaker 750. The resistor $R_{OFF}$ may be configured to provide the relatively smooth dissipation of the charges across the capacitor $C_{AC}$.

Figure 9:
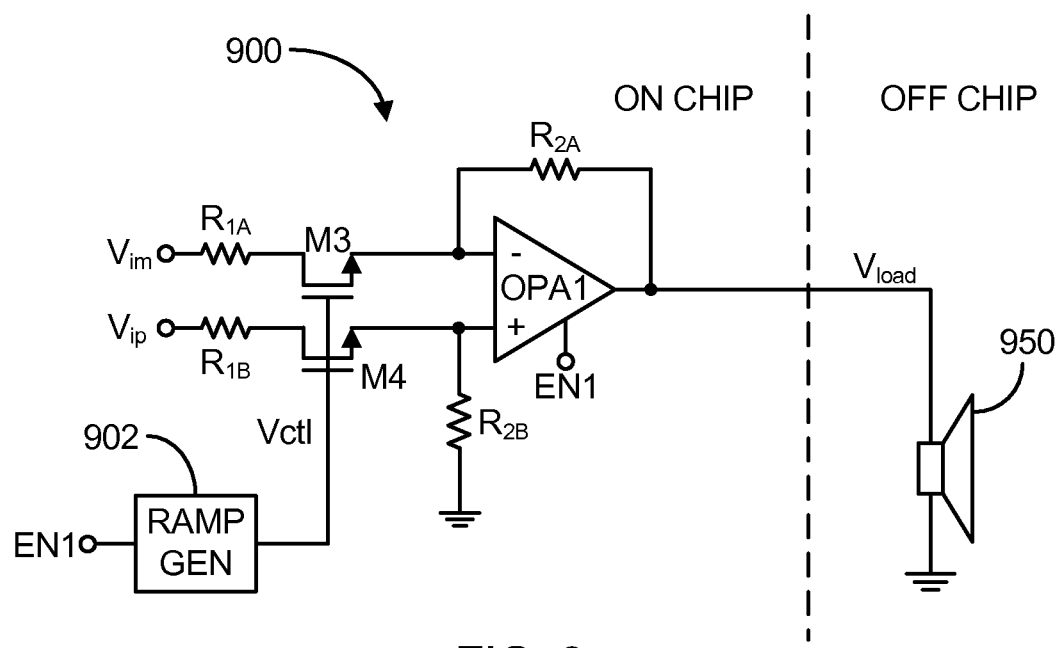
FIG. 9 illustrates a block diagram of a third exemplary audio system in accordance with another aspect of the disclosure.

FIG. 9 illustrates a block diagram of a third exemplary audio system 900 in accordance with another aspect of the disclosure. The audio system 900 is configured to reduce or eliminate click and pop noise for the case where the audio system is coupled to the associated speaker directly (e.g., in the absence of an AC coupling capacitor). In particular, the audio system 900 comprises an operational amplifier OPA1, resistors $R_{1A}$, $R_{1B}$, $R_{2A}$, and $R_{2B}$, FETs M3 and M4, and ramp generator 902. These devices may be implemented in one or more integrated circuits, discrete devices, or a combination of one or more integrated circuits and one or more discrete devices.

More specifically, the operational amplifier OPA1 includes a negative input (−) adapted to receive a negative component $V_{im}$ of an input differential audio signal by way of resistor $R_{1A}$ and the drain and source of FET M3. The operational amplifier OPA1 also includes a positive input terminal (+) adapted to receive a positive component $V_{im}$ of an input differential audio signal by way of resistor $R_{1B}$ and the drain and source of FET M4. It shall be understood that the input audio signal need not be configured as a differential signal. The resistor $R_{2B}$ is coupled between the positive input (+) of the operational amplifier OPA1 and Vss or ground potential. The operational amplifier OPA1 includes an output coupled to the negative input (−) by way of a feedback resistor $R_{2A}$. The output of the operational amplifier OPA1 may be coupled to the associated speaker without an intervening AC coupling capacitor. The ramp generator 902 is coupled to the gates of the FETs M3 and M4 to provide them a ramping control signal during power up and/or power down operation. Both the operational amplifier OPA1 and ramp generator 902 include an enable input to receive a control signal EN1.

In operation, prior to the audio system 900 being powered up, the control signal EN1 is at a low logic level to disable the operational amplifier OPA1 and the ramp generator 902. At power up, the control signal EN1 transitions from the low logic level to the high logic level. This causes the enabling of the operational amplifier OPA1 and the ramp generator 902. The ramp generator 902 generates a rising ramp control voltage Vctl which smoothly decreases the resistances of the FETs M3 and M4. This has the effect of smoothly applying the input audio signal ($V_{im}$ and $V_{ip}$) to the inputs of the operational amplifier OPA1. If there is any DC offset present in the input audio signal, the effect of smoothly decreasing the resistances of the FETs M3 and M4 causes the amplified DC offset voltage to smoothly appear at the output of the operational amplifier OPA1. The ramp generator 902 may be configured to generate the control voltage Vctl in a manner that the transitioning DC offset voltage at the output of the operational amplifier OPA1 reduces or eliminates click and pop noise from being generated at the associated speaker 950.

During normal or steady-state operation, the ramp generator 902 continues to generate a high logic level control signal Vctl to keep FETs M3 and M4 turned on to allow the input audio signal to be coupled to the input of the operational amplifier OPA1. In response to a power down operation, the control signal EN1 transitions from the high logic level to the low logic level to disable the operational amplifier OPA1 and the ramp generator 902. Alternatively, the ramp generator 902 may be configured to provide a descending ramp voltage so as to smoothly increase the resistances of the FETs M3 and M4 to smoothly decouple the input audio signal from the input of the operational amplifier OPA1. This causes the voltage at the output of the operational amplifier OPA1 to smoothly decay so as to prevent or eliminate click and pop noise from being generated by the associated speaker 950.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An audio system, comprising:
   an amplifier including an input adapted to receive an input audio signal and an output adapted to produce an output audio signal; and
   a noise reduction circuit adapted to generate a ramp control voltage exhibiting a substantially ramping waveform to control a continuously variable resistance device through which a substantially smooth rising DC voltage is applied to the output of the amplifier during a power up operation in a manner that reduces or eliminates noise from being generated by an associated speaker, and remove the DC voltage from the output of the amplifier during a power down operation in a manner that reduces or eliminates noise from being generated by the associated speaker.

2. The audio system of claim 1, wherein the amplifier comprises an operational amplifier.

3. The audio system of claim 1, wherein the noise includes click and pop noise.

4. The audio system of claim 1, wherein the noise reduction circuit comprises a selectable current path adapted to smoothly dissipate charges from the output of the amplifier to decrease the voltage in a manner that reduces or eliminates noise from being generated by an associated speaker during the power down operation.

5. The audio system of claim 4, wherein the current path comprises a resistive element in series with a controllable switch.

6. The audio system of claim 5, wherein the resistive element comprises a resistor and the controllable switch comprises a field effect transistor (FET) having drain and source coupled in series with the resistor and a gate adapted to receive a control signal.

7. The audio system of claim 1, further comprising a source adapted to generate the DC voltage.

8. The audio system of claim 7, wherein the noise reduction circuit comprises:
   the continuously variable resistance device coupled between the DC voltage source and the output of the amplifier; and
   a generator adapted to generate the ramp control signal that decreases the resistance of the continuously variable resistance device to smoothly apply the DC voltage from the DC voltage source to the output of the amplifier in a manner that reduces or eliminates noise from being generated by the associated speaker during the power up operation.

9. The audio system of claim 8, wherein the generator comprises a ramp generator and the continuously variable resistance device comprises a field effect transistor (FET).

10. The audio system of claim 9, wherein the ramp generator comprises:
a first current path adapted to generate a first current, wherein the first current path is selectable in response to a control signal;
a second current path coupled to the first current path in a minor fashion so as to generate a second current that is related to the first current by a first mirror ratio;
a third current path coupled to the first current path in a minor fashion so as to generate a third current that is related to the first current by a second minor ratio; and
a capacitive element coupled to the second and third current paths in a manner that a fourth current flows through the capacitive element, wherein the fourth current is a difference between the second and third current, and wherein the control voltage is generated at least partially across the capacitive element.

11. The audio system of claim 1, wherein the DC voltage at the output of the amplifier is derived from a DC offset voltage present in the input audio signal, and wherein the noise reduction circuit comprises:
the continuously variable resistance device coupled to the input of the amplifier; and
a generator adapted to generate a control signal that decreases or increases the resistance of the continuously variable resistance device so that the DC offset voltage is smoothly applied to or removed from the input of the amplifier in a manner that reduces or eliminates noise from being generated by the associated speaker during the power up or power down operation, respectively.

12. An audio system, comprising:
means for amplifying an input audio signal to generate an output audio signal; and
means for reducing noise from being generated by an associated speaker by generating a ramp control voltage exhibiting a substantially ramping waveform to control a means for continuously variably resistively coupling a source of a DC voltage to the output of the amplification means by smoothly applying the DC voltage to an output of the amplification means during a power up operation and smoothly removing the DC voltage from the output of the amplification means during a power down operation.

13. The audio system of claim 12, wherein the noise reduction means comprises a selectable current path adapted to smoothly dissipate charges from the output of the amplification means to decrease the DC voltage in a manner that reduces or eliminates noise from being generated by the associated speaker during the power down operation.

14. The audio system of claim 12, wherein the means for reducing noise comprises:
means for generating the ramp control signal that decreases the resistance of the continuously variable coupling means to smoothly apply the DC voltage from the source to the output of the amplification means in a manner that reduces or eliminates noise from being generated by the associated speaker during the power up operation.

15. The audio system of claim 14, wherein the control signal generating means comprises:
means for selectively generating a first current in response to a control signal;
means for generating a second current that is related to the first current by a first ratio;
means for generating a third current that is related to the first current by a second ratio;
means for generating a fourth current that is substantially the difference between the second and third currents; and
means for generating the control signal from the fourth current.

16. The audio system of claim 12, wherein the DC voltage at the output of the amplifier is derived from a DC offset voltage present in the input audio signal, and wherein the noise reduction means comprises:
means for coupling the input audio signal to the amplification means; and
means for generating a control signal that decreases or increases the resistance of the coupling means to smoothly apply or remove the input audio signal including the DC offset voltage to or from the input of the amplification means in a manner that reduces or eliminates noise from being generated by an associated speaker during the power up or power down operation, respectively.

17. A method of reducing noise in an audio system, comprising generating a ramp control voltage exhibiting a substantially ramping waveform to control a continuously variable resistance device through which to apply a DC voltage to an output of the audio system during a power up operation in a manner that reduces or eliminates noise from being generated by an associated speaker and removing the DC voltage from the output of the audio system during a power down operation in a manner that reduces or eliminates noise from being generated by the associated speaker.

18. The method of claim 17, wherein the noise includes click and pop noise.

19. The method of claim 17, wherein applying the DC voltage to the output of the audio system comprises smoothly coupling a source of the DC voltage to the output of the audio system.

20. The method of claim 17, wherein applying the DC voltage to the output of the audio system is in response to the power up operation of the audio system.

21. The method of claim 17, wherein the DC voltage is derived from an input audio signal.

22. The method of claim 17, wherein removing the DC voltage from the output of the audio system comprises smoothly dissipating charges from the output of the audio system.

23. The method of claim 17, wherein removing the DC voltage from the output of the audio system is in response to the power down operation of the audio system.

* * * * *